United States Patent
Lu et al.

(10) Patent No.: US 12,082,484 B2
(45) Date of Patent: Sep. 3, 2024

(54) FLUORINE-SUBSTITUTED PI-BRIDGE (PI-BRIDGE) SELENIDE POLYMER ACCEPTOR AND PREPARATION AND APPLICATION THEREOF

(71) Applicants: Taizhou University, Taizhou (CN); Taizhou huimo technology co., ltd, Taizhou (CN)

(72) Inventors: Shirong Lu, Taizhou (CN); Liu Zhu, Taizhou (CN)

(73) Assignees: TAIZHOU UNIVERSITY, Taizhou (CN); TAIZHOU HUIMO TECHNOLOGY CO., LTD, Taizhou City (CN)

( * ) Notice: Subject to any disclaimer, the term of this patent is extended or adjusted under 35 U.S.C. 154(b) by 91 days.

(21) Appl. No.: 18/073,140

(22) Filed: Dec. 1, 2022

(65) Prior Publication Data
US 2023/0180593 A1    Jun. 8, 2023

(30) Foreign Application Priority Data

Dec. 2, 2021    (CN) .......................... 202111476980.9

(51) Int. Cl.
| | | |
|---|---|---|
| H10K 85/10 | (2023.01) | |
| C08G 61/12 | (2006.01) | |
| H10K 30/30 | (2023.01) | |

(52) U.S. Cl.
CPC ......... *H10K 85/113* (2023.02); *C08G 61/126* (2013.01); *H10K 85/151* (2023.02); *C08G 2261/12* (2013.01); *C08G 2261/143* (2013.01); *C08G 2261/146* (2013.01); *C08G 2261/3223* (2013.01); *C08G 2261/3241* (2013.01); *C08G 2261/3246* (2013.01); *C08G 2261/91* (2013.01); *H10K 30/30* (2023.02)

(58) Field of Classification Search
CPC .... H10K 85/113; H10K 85/151; H10K 30/30; C08G 61/126; C08G 2261/12; C08G 2261/143; C08G 2261/146; C08G 2261/3223; C08G 2261/3241; C08G 2261/3246; C08G 2261/91; C08G 2261/124; C08G 2261/1412; C08G 2261/316; C08G 2261/3247; C08G 2261/344; C08G 2261/42; C08G 61/124; C08G 61/12; C08L 65/00; C09D 165/00; C09K 11/06; Y02E 10/549

See application file for complete search history.

(56) References Cited

FOREIGN PATENT DOCUMENTS

WO    WO-2021107674 A1 *  6/2021  ............. H10K 30/80

OTHER PUBLICATIONS

English machine translation of WO-2021107674-A1 (Year: 2024).*
Wolf, "Wide Band-Gap 3,4-Difluorothiophene-Based Polymer with 7% Solar Cell Efficiency: an Alternative to P3HT", Chem. Mater. 2015, 27, 4184-4187 (Year: 2015).*

* cited by examiner

*Primary Examiner* — Angelo Trivisonno
(74) *Attorney, Agent, or Firm* — Morgan, Lewis & Bockius LLP (57) ABSTRACT

Disclosed is a fluorine-substituted Pi(π)-bridge selenide polymer acceptor material, its preparation and application. The selenide polymer acceptor material is named PYSe2FT and is synthesized by Knoevenagel condensation reaction and Still cross-coupling reaction; the material PYSe2FT takes a selenium-substituted core donor unit as a main structure, and combines a difluoro-substituted thiophene π-electronic connection unit, where the selenium-substituted core donor unit and the difluoro-substituted thiophene π-electronic connection unit can effectively regulate and control the molecular energy level, so that molecules generate good accumulation, thus making PYSe-2FT an excellent polymer acceptor material.

9 Claims, 6 Drawing Sheets

FLUORINE-SUBSTITUTED PI-BRIDGE (PI-BRIDGE) SELENIDE POLYMER ACCEPTOR AND PREPARATION AND APPLICATION THEREOF

CROSS-REFERENCE TO RELATED APPLICATIONS

This application claims priority to Chinese Patent Application No. 202111476980.9, filed on Dec. 2, 2022, the contents of which are hereby incorporated by reference.

TECHNICAL FIELD

The present application relates to the field of polymer acceptors, specifically to the technical field of organic polymer photovoltaic devices or organic semiconductor thin film solar cells, and in particular to a fluorine-substituted Pi (π)-bridge) selenide polymer acceptor and its preparation and application.

BACKGROUND

Organic solar cell embraces a promising application prospect in the market as one of the most competitive systems among the third-generation solar cells, owing to its properties such as diverse and controllable material structure, good device processing performance, light weight, flexibility, solution-processable, and ability to prepare large area printing at low cost. Recent years saw a rapid development of the entire organic solar cell field along with the continuous advance in the organic semiconductor materials and the continuous improvement in device structure and process, with cell efficiency breaking through to new heights. In 2018, the efficiency of stacked organic solar cells exceeded 15 percent (%), and 17% in succession, and the new dense ring electron acceptor Y6 emerged in 2019 has brought the photoelectric conversion efficiency of organic solar cells to a new level. So far, the photoelectric conversion efficiency of single-layer organic solar cells has reached 19%, which has attracted extensive attention from academia and industry, and also accelerated the commercialization and industrialization of organic solar cells.

All-polymer organic solar cells (all-PSCs) have aroused great research interest in recent years on account of their excellent stability, light weight, flexibility, and potential for low-cost large-area manufacturing. At present, all-PSCs based on polymer donors and polymeric small molecule acceptors have achieved power conversion efficiencies (PCEs) of more than 17%. However, all-PSCs require complex post-treatment processes to optimize the morphology during production, as preaggregation of the polymer in the precursor solution and difficulty in forming an optimal active layer after preparation of the film are caused by the relatively strong intermolecular interactions and long molecular backbones of both the polymer donor and polymer acceptor; moreover, the molecular weights of different batches of polymer materials may vary, causing uneven performance of products between different batches. Therefore, an organic solar cell device that can be prepared by a simple process with molecular weight-insensitive polymer acceptor materials is of great interest.

SUMMARY

In view of the above-mentioned shortcomings of the prior art, the present application provides a fluorine-substituted Pi (π)-bridge) selenide polymer acceptor and its preparation and application to address the problems of complex preparation process of all-polymer organic solar cells (all-PSCs) in the prior art and the uneven performance of the products due to the existence of a certain difference in molecular weight of polymer materials in different batches.

In order to achieve the above objectives and other related objectives, one of the aspects of the present application provides a fluorine-substituted π-bridge selenide polymer acceptor material, with a name of PYSe-2FT and a chemical structural formula illustrated as follows:

where $R_1$ and $R_2$ are a substituted side chain at position 2 of selenophene and an alkyl chain substituted by pyrrole ring N, respectively, and * indicates a connecting position.

The fluorine-substituted π-bridge selenide polymer acceptor material PYSe-2FT provided by the present application takes a selenium-substituted core donor unit as a main structure, and combines a difluoro-substituted thiophene π-electronic connection unit, where the selenium-substituted core donor unit and the difluoro-substituted thiophene π-electronic connection unit can effectively regulate and control the molecular energy level, so that molecules generate good accumulation, thus making PYSe-2FT an excellent polymer acceptor material.

Another aspect of the present application provides a method for preparing the fluorine-substituted π-bridge selenide polymer acceptor, including: step 1: Knoevenagel condensation reaction, including dissolving a compound as shown in formula (I) and a compound as shown in formula (II) in an organic solvent A, adding a weak base catalyst B, followed by heating and stirring for reaction, and separating and purifying a reaction solution after the reaction to obtain a compound shown in formula (IV); and step 2: Still cross-coupling reaction, including dissolving a compound as shown in formula (III) and the compound shown in formula (IV) in an organic solvent C, adding a catalyst D and a catalyst E, heating and stirring for reaction under protection of inert gas, and after the reaction, separating and purifying a reaction solution to obtain the fluorine-substituted π-bridge selenide polymer acceptor PYSe-2FT;

Optionally, the heating and stirring for reaction in step 1 are carried out under temperature of 45-60 degree Celsius (CC) for a duration of 5-48 hours (h), and preferably at 50° C. for 12 h.

Optionally, the organic solvent A in step 1 includes at least one selected from a group of chloroform, dichloromethane, anhydrous oxygen-free toluene, preferably pure chloroform.

Optionally, the weak base catalyst B in step 1 includes at least one selected from a group of pyridine and piperidine, preferably pyridine.

Optionally, the compounds (I) and (II) used in step 1 are in a mole ratio of 1:(3-5), preferably 1:5.

Optionally, the weak base catalyst B and the compound (I) used in step 1 are in a mole ratio of 1:(5-20), preferably 1:3.

Optionally, the organic solvent A and the weak base catalyst B in step 1 are in a volume ratio of (3-8):1, preferably 5:1.

Optionally, a method for separating and purifying the reaction solution in step 1 includes: stopping heating after reaction, adding water after a reaction system is cooled to room temperature, then extracting with an organic solvent to obtain a lower organic phase and an upper aqueous phase, washing the organic phase, followed by drying, filtering, rotary steaming to obtain a crude product, washing the crude product with a solvent, filtering, and separating by silica gel column chromatography to obtain the compound shown in formula (IV).

Optionally, the organic solvent used for extracting in the method for separating and purifying the reaction in step 1 is any one of dichloromethane and chloroform.

Optionally, the organic phase in the method for separating and purifying the reaction in step 1 is washed with saturated NaCl aqueous solution and water in turn, and then dried.

Optionally, the method for separating and purifying the reaction in step 1 adopts a desiccant selected from a group of anhydrous magnesium sulfate and sodium sulfate.

Optionally, in the method for separating and purifying the reaction in step 1, the solvent used for washing the crude product is any one of methanol, n-hexane, acetone and isopropanol.

Optionally, in the method for separating and purifying the reaction in step 1, the crude product is subject to silica gel column chromatography of 200-300 meshes with a mixture of chloroform/petroleum ether as eluent, where the chloroform is in a volume ratio of (2-4):1 to the petroleum ether in the mixture of chloroform/petroleum ether, preferably 3:1.

Optionally, the inert gas in the step 2 includes any one of nitrogen and argon.

Optionally, the compounds (IV) and (III) used in the step 2 are in a mole ratio of 1:1 to 1:2, preferably 1:1.1.

Optionally, the catalyst D is in a mole ratio of 1:(6 percent (%)-8%) to the compound (III) in the step 2, preferably 1:8%.

Optionally, the organic solvent C, the catalyst D and the catalyst E used in step 2 are in a volume ratio of (10-20): (1-2):(4-8), preferably 20:1:4.

Optionally, the heating and stirring for reaction of step 2 are carried out under temperature of 100-120° C., preferably 110° C. Optionally, the heating and stirring for reaction of step 2 are carried out for a duration of >2 h, preferably 2-48 h, more preferably 2-12 h. The products with different molecular weights can be obtained after reaction of different duration; the selenide polymer acceptor material PYSe-2FT shows a number average molecular weight ($M_n$) of 5.6 kilodaltons (kDa) after 2 h of reaction; whereas after 4 h of reaction, the number average molecular weight (Me) of the selenide polymer acceptor material PYSe-2FT is 13.3 kDa, and that of the selenide polymer acceptor material PYSe-2FT after reaction of 8 h is 17.5 kDa, and 23.3 kDa after 24 h.

Optionally, the organic solvent C in the step 2 is at least one selected form a group of anhydrous oxygen-free toluene, N,N-dimethylformamide, tetrahydrofuran and anhydrous oxygen-free chlorobenzene, preferably anhydrous oxygen-free toluene.

Optionally, the catalyst D in the step 2 is a phosphorus catalyst of tris(o-methylphenyl)phosphorus.

Optionally, the catalyst E in the step 2 is a palladium catalyst, including at least one selected from a group of tris(dibenzylideneacetone)palladium, tetratriphenylphosphine palladium, bis(dibenzylideneacetone)palladium and bis(triphenylphosphine)palladium dichloride, preferably tris (dibenzylideneacetone)palladium.

Optionally, a method for separating and purifying the reaction solution in step 2 includes: stop heating after the reaction is finished, pouring a reaction system into methanol after the reaction system is cooled to room temperature so as to separate out solid precipitates, filtering and collecting the solid precipitates, purifying the solid precipitates with a Soxhlet extractor using methanol, acetone and hexane in sequence to remove products of small molecular weight; extracting a solution in the Soxhlet extractor with trichloromethane until the solution is colorless, removing the trichloromethane remained after extracting by rotary evaporation to obtain a crude product, separating the crude product by silica gel column chromatography to obtain the selenide polymer acceptor material PYSe-2FT with uniform molecular weight distribution.

Optionally, the methanol used in the method for separating and purifying the reaction solution in step 2 is used in an amount of more than 20 times of a volume of the reaction solution.

Optionally, the solid precipitates in the method for separating and purifying the reaction solution in step 2 are extracted with a Soxhlet extractor using methanol, acetone, and hexane in turn and for 10 to 15 h each, preferably 12 h.

Optionally, the crude product in the method for separating and purifying the reaction solution in step 2 is chromatographed on a 100-200 meshes silica gel column with pure trichloromethane as an eluent.

Another aspect of the present application provides an application of the selenide polymer acceptor PYSe-2FT as described in an aspect of the present application in preparing solar photovoltaic devices.

Another aspect of the present application provides an organic solar cell device, where the organic solar cell device includes the selenide polymer acceptor PYSe-2FT as described in an aspect of the present application.

Optionally, the organic solar cell device includes an active layer with donor material being any one of D18, D18-Si and OPz11.

Optionally, the organic solar cell device includes a cathode transparent conductive glass, where the cathode transparent conductive glass is made of indium tin oxide (ITO).

Optionally, the organic solar cell device includes a cathode modification layer (i.e., a hole transport layer), where the cathode modification layer is made of PEDOT:PSS, where the PEDOT is poly(3,4-ethylenedioxythiophene), a polymer of 3,4-ethylenedioxythiophene monomer (EDOT), and PSS is polystyrene sulfonate.

Optionally, the organic solar cell device includes an anode modification layer (i.e., an electron transport layer), and the anode modification layer is made of Phen-NaDPO (phenyl (2-naphthyl)diphenylphosphineoxide).

Optionally, the organic solar cell device also includes an anode with material of silver (Ag).

Optionally, the organic solar cell device adopts a forward cell structure.

As described above, the fluorine-substituted π-bridge selenide polymer acceptor PYSe-2FT and its preparation as well as application provided by the present application achieve the following beneficial effects:

the selenide polymer acceptor PYSe-2FT has excellent semiconductor properties, good self-assembly and stability as well as solution processability, and the synthesis process is simple, easy to prepare and insensitive to molecular weight; PYSe-2FT has great potential and application value in the field of organic solar cells and other photovoltaic devices; it can be used as an electron acceptor material for all-PSCs with simple processing and no requirement for any post-treatment (free-treatment), significantly improving the photoelectric conversion efficiency of all-PSCs and providing all-PSCs with excellent photoelectric performance.

DETAILED DESCRIPTION OF THE EMBODIMENTS

The following specific embodiments illustrate the embodiments of the present invention, and those skilled in the art can easily understand other advantages and efficacy of the present application from the disclosure of this specification. The application can also be implemented or applied by other different specific embodiments, and the details in this specification can be modified or changed based on different viewpoints and applications without departing from the spirit of the application.

The present application provides a fluorine-substituted Pi(it)-bridge selenide polymer acceptor named PYSe-2FT, with chemical structural formula illustrated as follows:

where $R_1$ and $R_2$ are a substituted side chain at position 2 of selenophene and an alkyl chain substituted by pyrrole ring N, respectively, and * indicates a connecting position.

Figure 1:
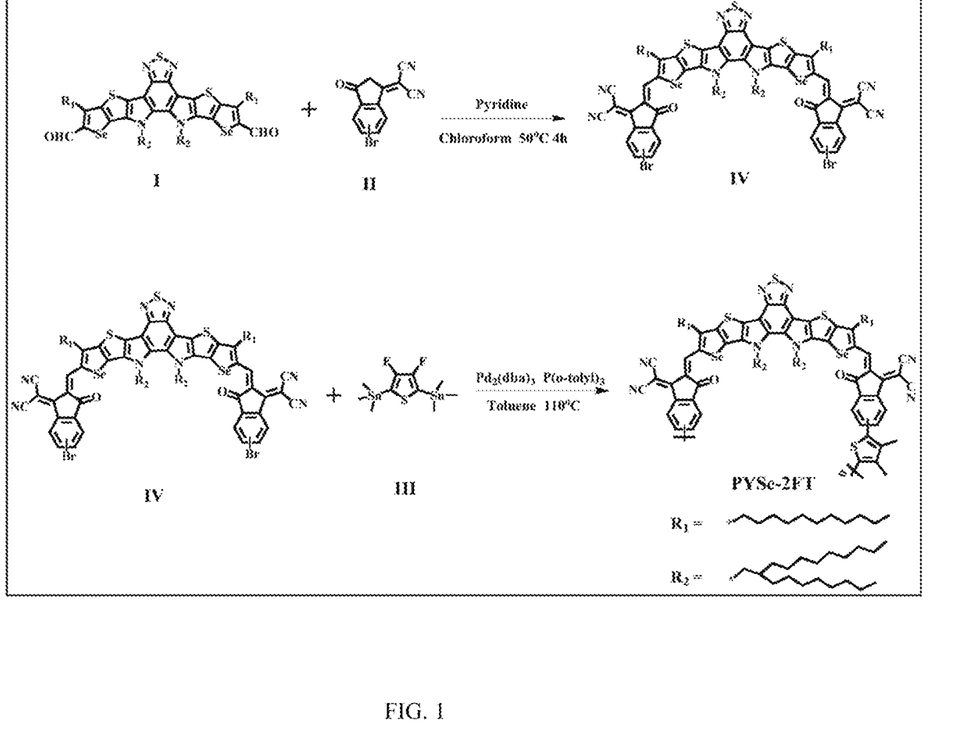
FIG. 1 shows a schematic synthetic route of polymer acceptor PYSe-2FT provided by the present application.

FIG. 1 shows a synthetic route of the fluorine-substituted π-bridge selenide polymer acceptor provided by the present application, including: step 1: Knoevenagel condensation reaction, including dissolving a compound as shown in formula (I) and a compound as shown in formula (II) in an organic solvent A, adding a weak base catalyst B, followed by heating and stirring for reaction, and separating and purifying a reaction solution after the reaction to obtain a compound shown in formula (IV); and step 2: Still cross-coupling reaction, including dissolving a compound as shown in formula (III) and the compound shown in formula (IV) in an organic solvent C, adding a catalyst D and a catalyst E, heating and stirring for reaction under protection of inert gas, and after the reaction, separating and purifying a reaction solution to obtain the fluorine-substituted π-bridge selenide polymer acceptor PYSe-2FT Specifically, the heating and stirring for reaction in step 1 are carried out under temperature of 45-60 degree Celsius (CC) for a duration of 5-48 hours (h), and preferably at 50° C. for 12 h.

Specifically, the organic solvent A in step 1 includes at least one selected from a group of chloroform, dichloromethane, anhydrous oxygen-free toluene, preferably pure chloroform; and the weak base catalyst B includes at least one selected from a group of pyridine and piperidine, preferably pyridine.

Specifically, in step 1, the compounds (I) and (II) are in a mole ratio of 1:(3-5), preferably 1:5; the weak base catalyst B and the compound (I) are in a mole ratio of 1:(5-20), preferably 1:3; and the organic solvent A and the weak base catalyst B are in a volume ratio of (3-8):1, preferably 5:1.

Specifically, a method for separating and purifying the reaction solution in step 1 includes: stopping heating after reaction, adding water after a reaction system is cooled to room temperature, then extracting with an organic solvent to obtain a lower organic phase and an upper aqueous phase, extracting the aqueous phase for several times, combining the organic phase and washing with saturated NaCl aqueous solution and water in turn, followed by drying with anhydrous $MgSO_4$ or sodium sulfate, then filtering and subjecting to rotatory evaporation to remove the solvent from a filtrate, obtaining a crude product, washing the organic phase, followed by drying, filtering, rotary steaming to obtain a crude product, washing the crude product with a solvent for 3 times, filtering, and separating by silica gel column chromatography of 200-300 meshes with a mixture of chloroform/petroleum ether (volume/volume (V/V)=3:1) as eluent, followed by separating by passing column, collecting effluent components and obtaining the compound shown in formula (IV); among them, the organic solvent used for extracting is any one of dichloromethane and chloroform; the solvent used for washing the crude product is any one of methanol, n-hexane, acetone and isopropanol; the mixture of chloroform/petroleum ether is used as the eluent for silica gel column chromatography, where the chloroform is in a volume ratio of (2-4):1 to the petroleum ether in the mixture of chloroform/petroleum ether, preferably 3:1.

Specifically, the inert gas in the step 2 includes any one of nitrogen and argon.

Specifically, in the step 2, the compounds (IV) and (III) used are in a mole ratio of 1:1 to 1:2, preferably 1:1.1; the catalyst D is in a mole ratio of 1:(6 percent (%)-8%) to the compound (III), preferably 1:8%; and the organic solvent C, the catalyst D and the catalyst E are in a volume ratio of (10-20):(1-2):(4-8), preferably 20:1:4.

Specifically, in the step 2, the heating and stirring for reaction of step 2 are carried out under temperature of 100-120° C., preferably 110° C.; the heating and stirring for reaction of step 2 are carried out for a duration of >2 h, preferably 2-48 h, more preferably 2-12 h. The products with different molecular weights can be obtained after reaction of different duration; the selenide polymer acceptor material PYSe-2FT shows a number average molecular weight ($M_n$) of 5.6 kilodaltons (kDa) after 2 h of reaction; whereas after 4 h of reaction, the number average molecular weight ($M_n$) of the selenide polymer acceptor material PYSe-2FT is 13.3 kDa, and that of the selenide polymer acceptor material PYSe-2FT after reaction of 8 h is 17.5 kDa, and 23.3 kDa after 24 h.

Specifically, in the step 2, the organic solvent C is at least one selected form a group of anhydrous oxygen-free toluene, and N,N-dimethylformamide, preferably anhydrous oxygen-free toluene; the catalyst D is tris(o-methylphenyl) phosphorus; and the catalyst E is a palladium catalyst, including at least one selected from a group of tris(dibenzylideneacetone)palladium, tetratriphenylphosphine palladium, bis(dibenzylideneacetone)palladium and bis(triphenylphosphine)palladium dichloride, preferably tris (dibenzylideneacetone)palladium.

Specifically, a method for separating and purifying the reaction solution in step 2 includes: stop heating after the reaction is finished, pouring a reaction system into methanol (with a volume of more than 20 times a volume of the reaction solution) after the reaction system is cooled to room temperature so as to separate out solid precipitates, filtering and collecting the solid precipitates, purifying the solid precipitates with a Soxhlet extractor using methanol, acetone and hexane in sequence and each for 10-15 h to remove products of small molecular weight; extracting a solution in the Soxhlet extractor with trichloromethane until the solution is colorless, removing the trichloromethane remained after extracting by rotary evaporation to obtain a crude product, separating the crude product by a small amount of silica gel column chromatography with pure chloroform as eluent, collecting effluent components and obtaining the polymer acceptor PYSe-2FT with uniform molecular weight distribution.

The fluorine-substituted π-bridge selenide polymer acceptor material PYSe-2FT provided by the present application takes a selenium-substituted core donor unit as a main structure, and combines a difluoro-substituted thiophene π-electronic connection unit, with excellent semiconductor properties, good self-assembly and stability as well as solution processability; and it is simple to synthesize, easy to prepare, and insensitive to molecular weight.

The selenide polymer acceptor PYSe-2FT provided by the present application can be used as an electron acceptor material for all-polymer organic solar cells (all-PSCs) with simple processing and no requirement for any post-treatment (free-treatment), significantly improving the photoelectric conversion efficiency of all-PSCs and providing all-PSCs with excellent photoelectric performance.

Figure 3:
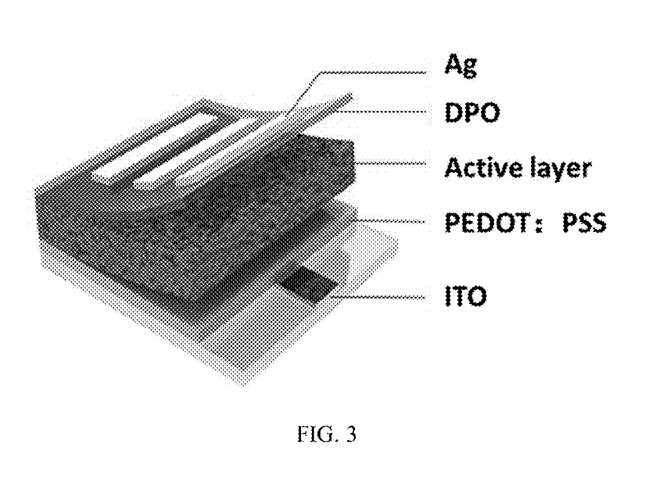
FIG. 3 shows a schematic structural diagram of an all-polymer organic solar cell (all-PSC) device according to the present application.

As shown in FIG. 3, the all-PSCs device of the present application adopts the forward cell structure of ITO/PEDOT:PSS/donor: PYSe-2FT/phenyl(2-naphthyl)diphenylphos-phineoxide (Phen-NaDPO)/silver (Ag), with a cathode modification layer ((i.e., cathode transparent conductive glass) made of indiumtinoxide (ITO), a cathode modification layer (i.e., hole transport layer) of poly(3,4-ethenyldi-oxythiophene) (PEDOT):poly(styrene sulfonate) (PSS), donor material of active layer being any one of D18, D18-Si and OPz11, acceptor material of active layer of PYSe-2FT, an anode modification layer (i.e. electron transport layer) of (Phen-NADPO, DPO), and anode material of Ag.

Figure 2:
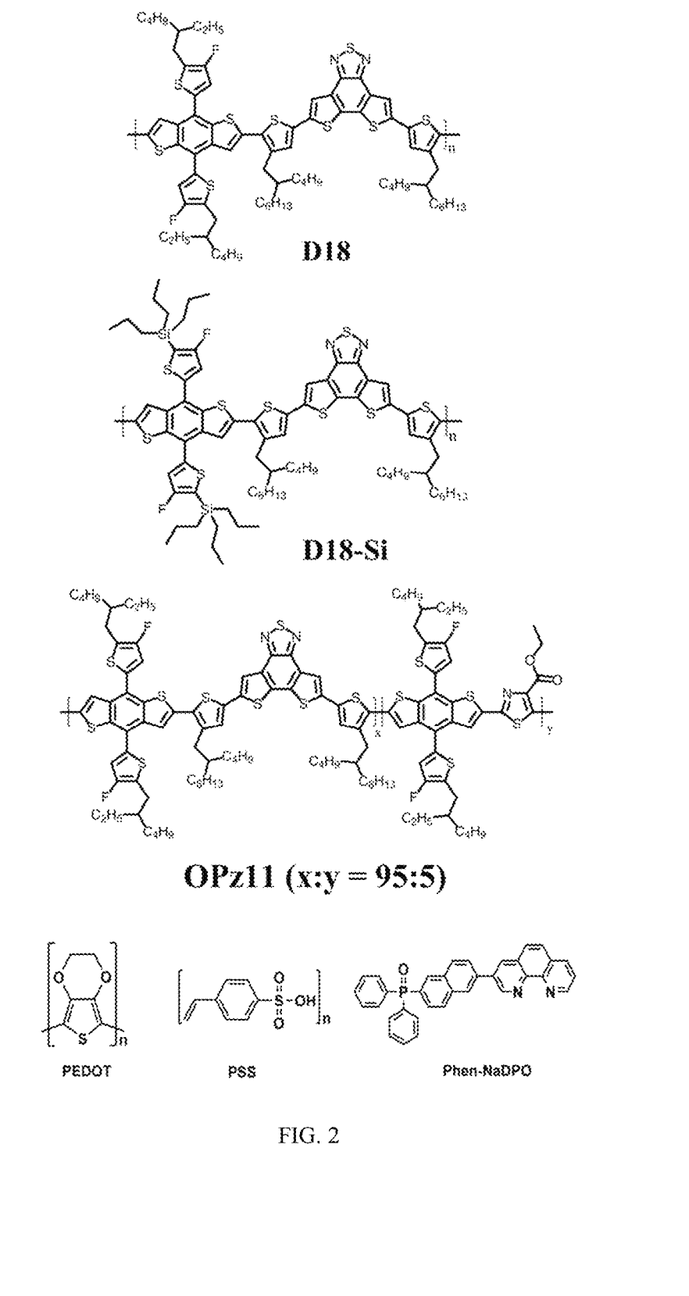
FIG. 2 illustrates chemical structural formulas of polymer donor materials D18, D18-Si, OPz11, poly(3,4-ethylenedioxythiophene) (PEDOT), polystyrene sulfonate (PSS) and phenyl(2-naphthyl)diphenylphosphineoxide (Phen-NaDPO) used in this application.

See FIG. 2 for the chemical structural formulas of D18, D18-Si, OPz11, PEDOT, PSS and Phen-NaDPO. The forward all-PSCs device provided by the present application is prepared by a method as follows:

a) cleaning ITO glass, including cleaning a substrate composed of transparent substrate layer and transparent conductive electrode ITO with deionized water, acetone and isopropyl alcohol, each for 30 minutes (min) respectively, and blow-drying with nitrogen after cleaning; then placing the substrate in an ozone cleaner for 30 min;

b) spin-coating the hole transport layer PEDOT:PSS on ITO glass with a thickness of 10-30 nanometers (nm), where the thickness of the hole transport layer in the following embodiments is 30 nm, and subjecting to thermal annealing treatment in air;

c) in a glove box filled with nitrogen, spin-coating the active layer mixture donor:PYSe-2FT on the hole transport layer PEDOT:PSS by solution method, with donor to the PYSe-2FT in a mass ratio of 1:1.1; specifically, the donor:PYSe-2FT is dissolved in chlorobenzene or chloroform with a concentration of 12 milligrams per milliliter (mg/mL), and a spin-coating thickness of that active layer of 80-300 nm, while that in the following embodiments is 120 nm;

d) spin-coating Phen-NaDPO isopropanol solution on the active layer to prepare an electron transport layer with a thickness of 10-50 nm, and the thickness of the electron transport layer in the following embodiments is 30 nm; and e) vapor-depositing a metal silver electrode on the Phen-NaDPO electron transport layer with a thickness of 90-100 nm, and the anode thickness in the following embodiments is 100 nm.

The raw material compounds, organic solvents, catalysts, electrode materials and modification layer materials used in the present application can be directly purchased from the market.

The methods not detailed in the present application are conventional methods in the field.

The following specific embodiments are given to illustrate the present application in detail. It should also be understood that the following embodiments are only used to specifically illustrate the present application, and should not be construed as limiting the scope of protection of the present application. Some non-essential improvements and adjustments made by those skilled in the art according to the above contents of the present application all belong to the scope of protection of the present application. The specific process parameters of the following embodiments are only one embodiment of the appropriate range, that is, those skilled in the art can make choices within the appropriate range through the description herein, and are not limited to the specific values of the following embodiments.

Embodiment 1

A fluorine-substituted π-bridge selenide polymer acceptor PYSe-2FT is prepared with a synthetic route as shown in FIG. 1, including: step 1: Knoevenagel condensation reaction, including dissolving a compound as shown in formula (I) and a compound as shown in formula (II) in an organic solvent A, adding a weak base catalyst B, followed by heating at 50° C., stirring and refluxing for 24 h, and separating and purifying a reaction solution to obtain the compounds shown in formula (IV), where the compounds (I), (II) and weak base catalyst B are in a molar ratio of 1:2.2:0.1, the organic solvent A is pure chloroform, the weak base catalyst B is pyridine, and the organic solvent A is in a volume ratio of 5:1 to the weak base catalyst B.

The reaction solution is separated and purified by a method as follows: after the reaction is finished, stopping heating, adding water after a reaction system is cooled to room temperature, extracting with chloroform to obtain a lower organic phase and an upper aqueous phase, extracting the aqueous phase for many times, combining the organic phase and washing with saturated NaCl aqueous solution and water in turn, drying with anhydrous $MgSO_4$, filtering, and removing solvent in a filtrate by rotary evaporation to obtain a crude product, washing the crude product with methanol solvent for three times, followed by filtering and subjecting to 200-300 meshes silica gel column chromatography with a chloroform/petroleum ether mixture (V/V=3:1) as eluent, and separating by passing through column to collect effluent components, thus obtaining the compound shown in formula (IV); and step 2: Still cross-coupling reaction, including dissolving a compound as shown in formula (III) and the compound shown in formula (IV) in an organic solvent C, adding a catalyst D and a catalyst E, heating at 100° C., stirring and refluxing, where the compounds (IV), (III) and the catalyst E are in a mole ratio of 1:1.1:8%, the organic solvent C is anhydrous oxygen-free toluene, the catalysts D and E are tri(o-methylphenyl)phosphorus and tri(dibenzylideneacetone) dipalladium respectively, with a volume ratio of organic solvent C, catalyst D and catalyst E of 20:1:4.

The reaction solution in step 2 is separated and purified by a method as follows: stop heating after the reaction is finished, pouring a reaction system into methanol (with a volume of more than 20 times a volume of the reaction solution) after the reaction system is cooled to room temperature so as to separate out solid precipitates, filtering and collecting the solid precipitates, purifying the solid precipitates with a Soxhlet extractor using methanol, acetone and hexane in sequence and each for 12 h to remove products of small molecular weight; extracting a solution in the Soxhlet extractor with trichloromethane until the solution is colorless, removing the trichloromethane remained after extracting by rotary evaporation to obtain a crude product, separating the crude product by a small amount of silica gel column chromatography of 100-200 meshes with pure chloroform as eluent, separating by passing through column and collecting effluent components to obtain the polymer acceptor PYSe-2FT with uniform molecular weight distribution.

The products with different molecular weights can be obtained after reaction of different duration; the selenide polymer acceptor material PYSe-2FT has a number average molecular weight ($M_n$) of 5.6 kDa after 2 h of reaction; whereas after 4 h of reaction, the number average molecular weight ($M_n$) of the selenide polymer acceptor material PYSe-2FT is about 13.3 kDa, and that of the selenide polymer acceptor material PYSe-2FT after reaction of 8 h is about 17.5 kDa, and 23.3 kDa after reaction over 24 h.

The compound PYSe-2FT has characterization data illustrated as follows:

$^1$HNMR (400 MHz, CDCl$_3$)δ 9.24-9.27 (d, 2H, =CH$^-$), 8.8 (s, 1H, ArH), 8.55 (m, 2H, ArH), 8.03 (s, 1H, ArH), 7.73-7.88 (m, 3H, ArH), 7.52 (m, 1H, ArH), 4.79 (m, 6H, CH), 3.22-3.24 (m, 2.5H, CH$_2$), 2.04-2.19 (m, 2H, CH$_2$), 1.85-1.1.87 (m, 6H, CH$_3$), 0.66-1.54 (m, 94H, CH$_2$ and CH$_3$).

Theoretical values of elements (%): C=68.48%, H=6.89%, S=7.07%, N %=5.14%; test values: C=68.16%, H=6.86%, S=7.28%, N %=4.77%.

Embodiment 2

A substrate composed of transparent substrate layer and transparent conductive electrode ITO is ultrasonically cleaned with cleaning solution, deionized water, acetone and isopropanol respectively, and then blow-dried with nitrogen, then the substrate is treated in an ozone cleaner for 30 min, followed by spin-coating with hole transport layer material PEDOT:PSS (4,000 revolutions per minute (rpm) for 20 seconds (s)) in air, followed by thermal annealing (130° C., 15 min) in the air and introducing into a glove box filled with nitrogen, and the active layer (D18: PYSe-2FT ($M_n$=17.5 kDa)=1:1.1, 12 mg/mL; D18-Si:PYSe-2FT ($M_n$=17.5 kDa)= 1:1.1, 12 mg/mL; OPz11:PYSe-2FT ($M_n$=17.5 kDa)=1:1.1, 12 mg/mL) is prepared by spin-coating on the hole transport layer PEDOT:PSS; an electron transport layer DPO is then spin-coated (2,000 rpm, 20 s) on the active layer, followed by vapor-depositing Ag electrode (100 nm) on the electron transport layer to prepare an all-PSC device.

Embodiment 3

A substrate composed of transparent substrate layer and transparent conductive electrode ITO is ultrasonically cleaned with cleaning solution, deionized water, acetone and isopropanol respectively, and then blow-dried with nitrogen; the substrate is treated in an ozone cleaner for 30 min, and spin-coated (4,000 rpm, 20 s) with hole transport layer material PEDOT:PSS in the air, followed by thermal annealing (130° C., 15 min) in the air; then the substrate sample is introduced into a glove box filled with nitrogen, and the active layer is prepared on the hole transport layer PEDOT:PSS by spin-coating (D18:PY6-Se-1=1:1.1, 12 mg/mL, PYSe-2FT ($M_n$=5687), 3.000 rpm, 30 s); the electron transport layer DPO is then spin-coated (2,000 rpm, 20 s) on the active layer, and then the Ag electrode (100 nm) is vapor-deposited on the electron transport layer, and an all-PSC device is prepared.

Embodiment 4

A substrate composed of transparent substrate layer and transparent conductive electrode ITO is ultrasonically cleaned with cleaning solution, deionized water, acetone and isopropanol respectively, and then blow-dried with nitrogen; then the substrate is treated in an ozone cleaner for 20 min then spin-coated (4,000 rpm, 20 s) with hole transport layer material PEDOT:PSS, followed by thermal annealing (130° C., 15 min) in the air; then the substrate sample is introduced into a glove box filled with nitrogen, and the active layer is prepared on the PEDOT:PSS hole transport layer (D18: PYSe-2FT=1:1.1, 12 mg/mL, PYSe-2FT with $M_n$ =13373, 3,000 rpm, 30 s) by spin-coating method; then, the electron transport layer DPO is spin-coated (2,000 rpm, 20 s) on the active layer, and then the Ag electrode (100 nm) is vapor-deposited on the electron transport layer, and an all-PSC device is prepared.

Embodiment 5

A substrate composed of transparent substrate layer and transparent conductive electrode ITO is ultrasonically cleaned with cleaning solution, deionized water, acetone and isopropanol respectively, and then blow-dried with nitrogen; after treatment in an ozone cleaner for 20 min, the substrate is spin-coated (4,000 rpm, 20 s) with hole transport layer material PEDOT:PSS in the air, followed by thermal annealing (130° C., 15 min) in the air; then the substrate sample is introduced into a glove box filled with nitrogen, and the active layer is prepared on the PEDOT:PSS hole transport layer (D18:PYSe-2FT=1:1.1, 12 mg/mL, PYSe-2FT with $M_n$, =17536, 3,000 rpm, 30 s) by spin-coating method; then, the electron transport layer DPO is spin-coated (2,000 rpm, 20 s) on the active layer, and then the Ag electrode (100 nm) is vapor-deposited on the electron transport layer, and an all-PSC device is prepared.

Embodiment 6

A substrate composed of transparent substrate layer and transparent conductive electrode ITO is ultrasonically cleaned with cleaning solution, deionized water, acetone and isopropanol respectively, and then blow-dried with nitrogen; then the substrate is treated in an ozone cleaner for 20 min, and spin-coated (4,000 rpm, 20, s) with hole transport layer material PEDOT:PSS, followed by thermal annealing (130° C., 15 min) in the air; then the substrate sample is introduced into a glove box filled with nitrogen, and the active layer is prepared on the PEDOT:PSS hole transport layer (D18: PYSe-2FT=1:1.1, 12 mg/mL, PYSe-2FT with $M_n$=23302, 3,000 rpm, 30 s) by spin-coating method; then the electron transport layer DPO (2,000 rpm, 20 s) is spin-coated on the active layer, and the Ag electrode (100 nm) is vapor-deposited on the electron transport layer to obtain an all-PSC device.

Figure 4:
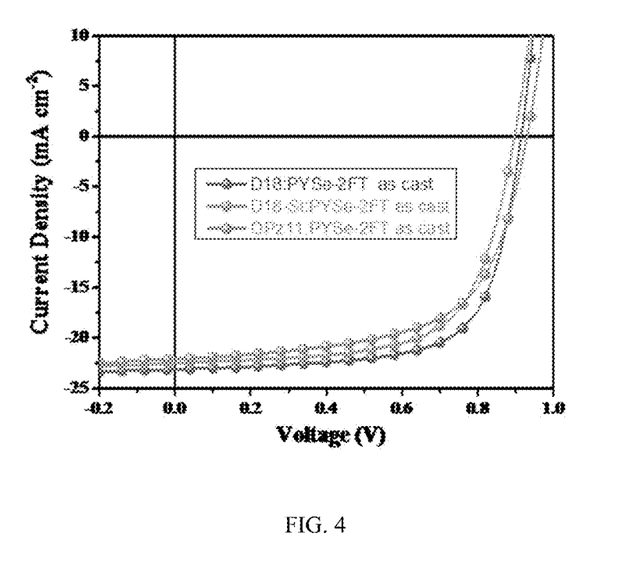
FIG. 4 is a graph illustrating current density-voltage characteristics (J-V) of an all-PSC device based on D18: PYSe-2FT, D18-Si:PYSe-2FT and OPz11:PYSe-2FT in Embodiment 2 of the present application.
Figure 5:
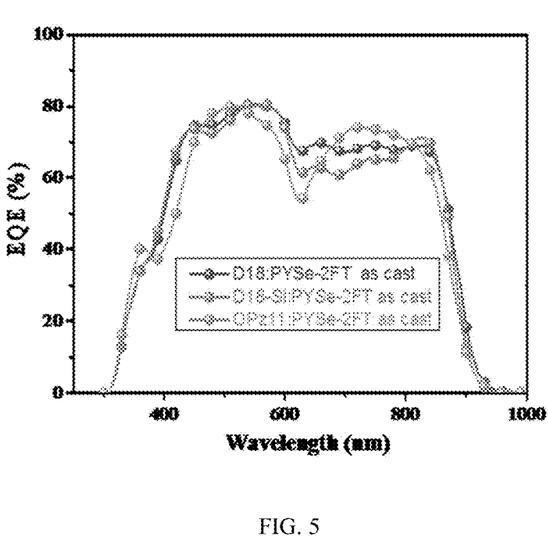
FIG. 5 shows external quantum efficiency (EQE) curves of the all-PSC devices based on D18:PYSe-2FT, D18-Si: PYSe-2FT and OPz11:PYSe-2FT in Embodiment 2 of the present application.
Figure 6:
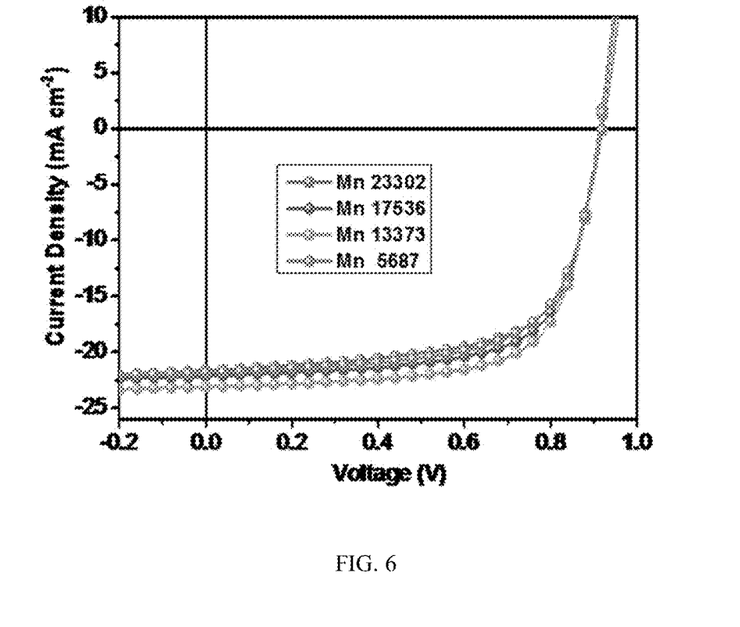
FIG. 6 is a graph showing the current density-voltage characteristics (J-V) of all-PSC devices prepared by matching D18 with PYSe-2FT of different molecular weights in Embodiments 3-6 of the present application.

Under the irradiation condition of global spectrum (AM1.5G, light intensity 100 milliwatt per square centimeter (mW·cm$^{-2}$), the all-PSC devices prepared in Embodiments 2-6 are tested in terms of performance, with Tables 1 and 2 illustrating photovoltaic performance parameters of the devices in Embodiments 2-6 respectively, FIG. 4 showing the current density-voltage (J-V) curves of the devices in Embodiment 2, FIG. 5 showing external quantum efficiency (EQE), and FIG. 6 showing the J-V curves of all-PSC devices prepared by matching D18 with PYSe-2FT of different molecular weights in Embodiments 3-6 of the present application.

TABLE 1

Photovoltaic Performance Parameters of all-PSC devices based on D18:PYSe-2FT, D18-Si:PYSe-2FT and OPz11:PYSe-2FT

| Active layer | post-treatment | $V_{OC}$ [mV] | $J_{SC}$ [mA·cm$^{-2}$] | FF [%] | $PCE_{Max}$ [%] | EQE [mA·cm$^{-2}$] |
|---|---|---|---|---|---|---|
| D18:PYSe-2FT | no | 0.915 | 23.11 | 68.78 | 14.54 | 22.90 |
| D18-Si:PYSe-2FT | no | 0.897 | 22.51 | 65.38 | 13.21 | 22.09 |
| OPz11:PYSe-2FT | no | 0.930 | 22.10 | 61.74 | 12.70 | 21.92 |

TABLE 2

Photovoltaic performance parameters of all-PSC devices with different PYSe-2FT molecular weights based on D18:PYSe-2FT devices

| Active layer | PYSe-FT molecular weight $M_n$ | post-treatment | $V_{OC}$ [mV] | $J_{SC}$ [mA·cm$^{-2}$] | FF [%] | $PCE_{Max}$ [%] |
|---|---|---|---|---|---|---|
| D18:PYSe-FT | 22302 | no | 0.913 | 21.66 | 66.00 | 13.17 |
|  | 17536 | no | 0.915 | 22.12 | 68.20 | 13.81 |
|  | 13373 | no | 0.915 | 23.11 | 68.78 | 14.54 |
|  | 5687 | no | 0.920 | 21.84 | 65.85 | 13.24 |

It can be seen from Table 1 that the highest efficiency of the device based on D18:PYSe-2FT is 14.54%, the open-circuit voltage (Voc) is 0.915 Volts (V), the current density ($J_{SC}$) is 21.11 milliamperes per square centimeter (mA·cm$^{-2}$), and the filling factor (FF) is 68.87% without any post-treatment of the active layer; the device based on D18-Si:PYSe-2FT has the highest efficiency of 13.21%, Voc of 0.897 V, $J_{SC}$ of 22.51 mA·cm$^2$ and FF of 65.38%; and the device based on OPz11:PYSe-2FT has the highest efficiency of 12.70%, Voc of 0.930 V, $J_{SC}$ of 22.10 mA·cm$^{-2}$ and FF of 61.74%.

It can be seen from FIG. 4 that the EQE curves of the device based on D18:PYSe-2FT is slightly higher than that of devices based on D18-Si:PYSe-2FT and OPz11:PYSe-2FT, indicating that the ratio of electrons collected by the device based on D18:PYSe-2FT to incident photons is higher than that based on D18-Si:PYSe-2FT and OPz11:PYSe-2FT. The EQE curves suggest that the all-PSC devices based on D18:PYSe-2FT, D18-Si:PYSe-2FT and OPz11:PYSe-2FT have wide photocurrent response from 300 nm to 1,000 nm; by integrating EQE curves, the $J_{SC}$ values of devices based on D18:PYSe-2FT, D18-Si:PYSe-2FT and OPz11:PYSe-2FT are 22.90 mA·cm$^2$, 22.09 mA·cm$^2$ and 21.92 mA·cm$^{-2}$ respectively, with errors within 3% compared to the values obtained from the J-V curve.

As can be seen from Table 2 and FIG. 6, with the increase of molecular weight of PYSe-2FT from 5.6 kDa to 23.3 kDa, the performance of photovoltaic devices based on D18:PYSe-2FT is less affected by the molecular weight of PYSe-2FT (the energy conversion efficiency is all kept above 13%), suggesting that the performance of photovoltaic devices is not affected by the batches of PYSe-2FT polymers, and the product is insensitive to the molecular weight of polymers, making it favorable for industrial production of PYSe-2FT polymer receptor materials.

The above embodiments only illustrate the principle and efficacy of the present application, and are not intended to limit the present application. Anyone skilled in the art can modify or change the above embodiments without departing from the spirit and scope of the present application. Therefore, all equivalent modifications or changes made by those with ordinary knowledge in the technical field without departing from the spirit and technical idea disclosed by the present application should still be covered by the claims of the present application.

What is claimed is:

1. A fluorine-substituted Pi (π)-bridge) selenide polymer acceptor material, named PYSe-2FT, comprising a chemical structural formula illustrated as follows:

wherein $R_1$ and $R_2$ are a substituted side chain at position 2 of selenophene and an alkyl chain substituted by pyrrole ring N, respectively, and * indicates a connecting position.

2. A method for preparing the fluorine-substituted π-bridge selenide polymer acceptor material PYSe-2FT, comprising step 1: Knoevenagel condensation reaction, comprising dissolving a compound as shown in formula (I) and a compound as shown in formula (II) in an organic solvent A, adding a weak base catalyst B, followed by heating and stirring for reaction, and separating and purifying a reaction solution after the reaction to obtain a compound shown in formula (IV); and step 2: Still cross-coupling reaction, comprising dissolving a compound as shown in formula (III) and the compound shown in formula (IV) in an organic solvent C, adding a catalyst D and a catalyst E, heating and stirring for reaction under protection of inert gas, and after the reaction, separating and purifying a reaction solution to obtain the fluorine-substituted π-bridge selenide polymer acceptor PYSe-2FT;

PYSE-2FT

3. The method for preparing the fluorine-substituted π-bridge selenide polymer acceptor material PYSe-2FT according to claim 2, wherein the heating and stirring for reaction in step 1 are carried out under temperature of 45-60 degree Celsius (CC) for a duration of 12-48 hours (h);

and, the heating and stirring for reaction of step 2 are carried out under temperature of 100-120° C. for a duration of ≥ 2 h.

4. The method for preparing the fluorine-substituted π-bridge selenide polymer acceptor material PYSe-2FT according to claim 2, wherein the organic solvent A in step 1 comprises at least one selected from a group of chloroform, anhydrous oxygen-free toluene, and N,N-dimethylformamide;

and, the organic solvent A in step 1 comprises at least one selected from a group of chloroform, dichloromethane, anhydrous oxygen-free toluene;

and, the organic solvent C in the step 2 comprises at least one selected form a group of anhydrous oxygen-free toluene and N,N-dimethylformamide;

and, the catalyst D in the step 2 is a phosphorus catalyst of tris(o-methylphenyl)phosphorus;

and, the catalyst E in the step 2 is a palladium catalyst, comprising at least one selected from a group of tris(dibenzylideneacetone)palladium, tetratriphenylphosphine palladium, bis(dibenzylideneacetone) palladium and bis(triphenylphosphine)palladium dichloride, preferably tris(dibenzylideneacetone)palladium.

5. The method for preparing the fluorine-substituted π-bridge selenide polymer acceptor material PYSe-2FT according to claim 2, wherein the compounds (I) and (II) used in step 1 are in a mole ratio of 1:(3-5), the weak base catalyst B and the compound (I) are in a mole ratio of 1:(5-20), and the organic solvent A and the weak base catalyst B are in a volume ratio of (3-8):1;

wherein in the step 2, the compounds (IV) and (III) used are in a mole ratio of 1:1 to 1:2, the catalyst D is in a mole ratio of 1:(6 percent (%)-8%) to the compound (III), and the organic solvent C, the catalyst D and the catalyst E are in a volume ratio of (10-20):(1-2):(4-8).

6. The method for preparing the fluorine-substituted π-bridge selenide polymer acceptor material PYSe-2FT according to claim 2, wherein a method for separating and purifying the reaction solution in step 1 comprises: stopping heating after reaction, adding water after a reaction system is cooled to room temperature, then extracting with an organic solvent to obtain a lower organic phase and an upper aqueous phase, washing the organic phase, followed by drying, filtering, rotary steaming to obtain a crude product, washing the crude product with a solvent, filtering, and separating by silica gel column chromatography to obtain the compound shown in formula (IV);

and, a method for separating and purifying the reaction solution in step 2 comprises: stop heating after the reaction is finished, pouring a reaction system into methanol after the reaction system is cooled to room temperature so as to separate out solid precipitates, filtering and collecting the solid precipitates, purifying the solid precipitates with a Soxhlet extractor using methanol, acetone and hexane in sequence to remove products of small molecular weight; extracting a solution in the Soxhlet extractor with trichloromethane until the solution is colorless, removing the trichloromethane remained after extracting by rotary evaporation to obtain a crude product, separating the crude product by silica gel column chromatography to obtain the selenide polymer acceptor material PYSe-2FT with uniform molecular weight distribution.

7. An organic solar cell device, comprising the selenide polymer acceptor PYSe-2FT according to claim 1.

8. The organic solar cell device according to claim 7, wherein the organic solar cell device comprises an active layer, a cathode transparent conductive glass, a cathode modification layer, an anode modification layer and an anode.

9. The organic solar cell device according to claim 7, wherein the organic solar cell device adopts a forward cell structure.

* * * * *